(12) United States Patent
Aston et al.

(10) Patent No.: US 6,282,592 B1
(45) Date of Patent: Aug. 28, 2001

(54) METHOD AND APPARATUS FOR HIGH-SPEED DATA TRANSMISSION BUS ENTRAINMENT

(75) Inventors: Robert Allan Aston; James Leslie Watchorn; James C. McLaughlin, all of Nepean (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/210,536

(22) Filed: Dec. 14, 1998

(51) Int. Cl.[7] ................................................ G06F 13/00
(52) U.S. Cl. ........................ 710/100; 710/126; 714/30
(58) Field of Search ............................... 710/100, 126, 710/131; 711/201; 714/30

(56) References Cited

U.S. PATENT DOCUMENTS 5,055,997 * 10/1991 Sluijter et al. .
5,589,833 * 12/1996 Randall et al. .................. 342/195
5,761,530 * 6/1998 Funahashi et al. ................. 710/15
5,822,334 * 10/1998 Whittaker et al. ................ 714/763

OTHER PUBLICATIONS

U.S. application No. 08/997,777, John Gordon Hogeboom, filed Dec. 12, 1997.
U.S. application No. 09/002,113, John Gordon Hogeboom, filed Dec. 31, 1997.

* cited by examiner

Primary Examiner—Ario Etienne

(57) ABSTRACT

The present invention relates to a control device, for use on an electronic circuit board, to perform high-speed data transmission bus entrainment. The control device includes a signal processing component acquiring either one of two modes of operation, specifically a diagnostic mode and a bus entrainment diagnostic mode. When in diagnostic mode, the signal processing component performs a diagnostic procedure on the electronic circuit board. When in bus entrainment mode, the signal processing component performs a bus entrainment procedure.

15 Claims, 5 Drawing Sheets

METHOD AND APPARATUS FOR HIGH-SPEED DATA TRANSMISSION BUS ENTRAINMENT

FIELD OF THE INVENTION

The present invention relates to the field of data transmission, more particularly to the entrainment required to adjust a high-speed data transmission bus in order to compensate for both internal and external delays.

BACKGROUND OF THE INVENTION

High-speed data communication systems have a need for improved maintenance of primary clock timing and synchronization of data carried by high-speed data buses. In a co-pending Patent Application entitled "Parallel Data Bus Integrated Clocking and Control" by John Gordon Hogeboom and assigned to Northern Telecom Limited, a high-speed parallel data bus having a single integrated signal path carrying both synchronous clock information and control data is disclosed. In this invention, the clock signal is transmitted at a lower rate, and only a primary edge, for example the falling edge, is used to control the timing of a phase-locked loop (PLL), which can then regenerate all required equal or high-rate clocks with required stability and phase relations. By using only timing increments of one bit time for the clock signal high and low periods, the same transmission media and interfaces may be used for the clock as are normally used for the associated data stream or streams. Furthermore, the alternate edge of the signal is independently modulated in increments of one data bit time to carry control data. Control data transmitted in this way, integrated with the clock signal, may be used in a process of adjusting or "trimming" delays of data from two or more sources multiplexed onto a data line. At the receiving end of the bus, the delays are adjusted in accordance with the control data, so that the various multiplexed data streams will align with each other in time at data receivers used to recover the bit streams. The clock signal is an ideal signal to carry such control data, since it must already connect to all transmitters and receivers, and because it directly provides the timing information needed to optimally recover the data it carries. In summary, the invention by John Gordon Hogeboom provides efficient means for achieving both a synchronous clock and a control data channel in a single signal path used with a high-speed parallel data bus, where the bus is implemented in a more compact and flexible manner than existing buses and achieves the maximum speed capability and/or the maximum margins for a given speed requirement.

An important issue for such a high-speed data bus is the transmission delays which occur both internally and externally to the bus itself. The term "entrainment" refers to the sampling and comparing of data which takes place at both the transmitting and receiving ends of the bus in order to regulate these delays and ensure the correct alignment of the data. For example, assume that 8 sources, each receiving 4 serial bits and outputting a 4 bit wide bus, all output their data at what they believe is the same time in order to form a 32 bit wide data bus. The correct format for the output over 6 clock cycles is:

|     | S1   | S2   | S3   | S4   | S5   | S6   | S7   | S8   |
| --- | ---- | ---- | ---- | ---- | ---- | ---- | ---- | ---- |
| cc1 | 0000 | 0000 | 0000 | 0000 | 0000 | 0000 | 0000 | 0000 |
| cc2 | 0000 | 0000 | 0000 | 0000 | 0000 | 0000 | 0000 | 0000 |
| cc3 | 0000 | 0000 | 0000 | 0000 | 0000 | 0000 | 0000 | 0000 |
| cc4 | 1111 | 1111 | 1111 | 1111 | 1111 | 1111 | 1111 | 1111 |
| cc5 | 0000 | 0000 | 0000 | 0000 | 0000 | 0000 | 0000 | 0000 |
| cc6 | 0000 | 0000 | 0000 | 0000 | 0000 | 0000 | 0000 | 0000 |

Unfortunately, due to circuit board routing and varying environmental conditions, such as temperature, over time the 32 bits may become out of step with each other. Some of the bits may be early, while others may be late. The sampled and merged 32 bit bus may look like the following instead:

|     | S1   | S2   | S3   | S4   | S5   | S6   | S7   | S8   |
| --- | ---- | ---- | ---- | ---- | ---- | ---- | ---- | ---- |
| cc1 | 0000 | 0000 | 0000 | 0000 | 0000 | 0000 | 0000 | 0000 |
| cc2 | 0000 | 0000 | 0000 | 0000 | 0000 | 0000 | 0000 | 0000 |
| cc3 | 0000 | 0001 | 0000 | 0000 | 0000 | 1100 | 0000 | 0000 |
| cc4 | 0011 | 1110 | 1111 | 1011 | 1110 | 0011 | 1110 | 1111 |
| cc5 | 1100 | 0000 | 0000 | 0100 | 0001 | 0000 | 0001 | 0000 |
| cc6 | 0000 | 0000 | 0000 | 0000 | 0000 | 0000 | 0000 | 0000 |

It is through entrainment that this incorrectly timed output can be realigned into the correct format.

The entrainment takes place at the hardware devices which use the high-speed data bus to transmit and receive data, for example a chip on an integrated circuit board, whereby such a device must include multiple high-speed connections. In general, for each high-speed connection, a bidirectional data pad cell within the hardware device is capable of both transmitting data to and receiving data from the connection. In the former case, the data pad cell is also referred to as a driver, whereas in the latter case, the data pad cell is also referred to as a receiver. In order to perform entrainment in the receive direction, the data pad cell must sample incoming data near the center of the data eye pattern. In order to do this, the pad must be able to control the sampling point to within a fraction of a bit time. Typically, the data pad cells of a device do contain such a sampling circuit, controlled by the device core, to allow the bit sample point to be fine grain adjusted. This adjustment consists in shifting the sample point whenever circuit board routing and various environmental factors cause a shift in the incoming data. Unfortunately, existing sampling circuitry lacks the ability to measure and control this adjustment from the core of the terminal device. Without this ability, the entrainment of a high-speed data transmission bus by such a device is much more complex and expensive. A similar situation occurs in the transmit direction.

Existing methods for performing the entrainment of a high-speed data transmission bus include reversing the data bus to return entrainment status, and providing entrainment signaling via a separate bus channel. Unfortunately, such methods have important disadvantages, such as complex hardware which can not be altered once cast in silicon, and the requirement for additional dedicated device I/O pins, to be used only for entrainment control and status feedback.

The background information provided above shows that there exists a need in the industry to provide an improved system and method for entraining a high-speed data transmission bus, in order to correct the data misalignment caused by the internal and external transmission bus delays.

SUMMARY OF THE INVENTION

The present invention is directed to the entrainment of a high-speed data transmission bus. Such entrainment is useful to compensate for the internal and external transmission delays which cause the misalignment of data being received or transmitted over the bus.

The present invention is particularly useful in applications where the high-speed data transmission bus to be entrained is an inter-device bus on a Printed Circuit Board (PCB), where the PCB supports the JTAG standard. This standard allows for internal device testing of logic and memory, plus external PCB level connectivity, and includes a JTAG master device responsible for operating the different JTAG scan modes for the entire PCB and also for performing the bus entrainment procedure. Specifically the JTAG master device controls multiple JTAG slave devices, one of which is present on each hardware device on the PCB. One important feature of the JTAG standard is that none of the JTAG scan operations may be run by the JTAG master device while a hardware device, such as a chip, is in normal operation since the scanning of internal data will destroy all information previously saved in the internal memory elements (flip-flops).

In summary, the invention provides for use of the JTAG master to perform bus entrainment after any initial diagnostic procedure, such as the power up scan, has completed, since the PCB JTAG master device serves no useful function once out of scan mode, also referred to as diagnostic mode. A novel mode of operation is supported by the JTAG master device, in addition to the scan or diagnostic mode, specifically a bus entrainment mode. This mode is only enabled when suitable conditions exist, i.e. when the PCB is in normal operation and the JTAG master device is out of the diagnostic mode. When the JTAG master is in entrainment mode, the use of a JTAG scan chain as an entrainment scan chain provides the ability to send commands to the high-speed data transmission bus drivers and receivers and to read status information from the receivers, for performing sample point entrainment.

BRIEF DESCRIPTION OF THE DRAWINGS

These and other features of the present invention will become apparent from the following detailed description considered in connection with the accompanying drawings. It is to be understood, however, that the drawings are provided for purposes of illustration only and not as a definition of the boundaries of the invention, for which reference should be made to the appending claims.

DESCRIPTION OF A PREFERRED EMBODIMENT

Figure 1:
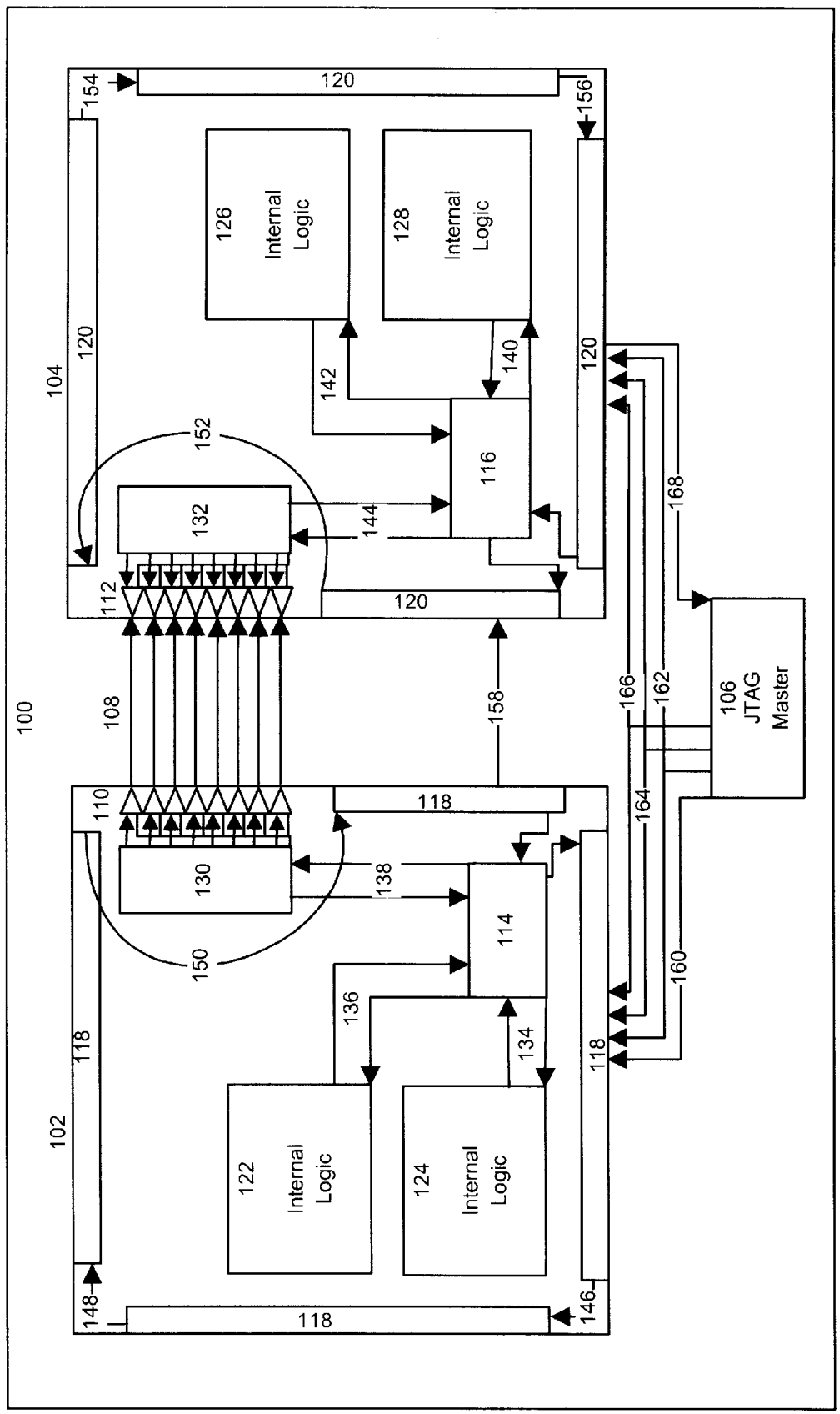
FIG. 1 is a structural block diagram of printed circuit board supporting the JTAG standard, for use in the entrainment of an inter-device high-speed data transmission bus.

As the complexity of circuit board hardware has increased, it has become increasingly difficult to reliably test hardware devices, such as chips, both during manufacture and in operational system tests. To assist in this testing, test and maintenance buses are typically used to provide a minimally-intrusive path to every hardware module in a system, in order to isolate and debug failures and possibly reconfigure data flows and computational elements to avoid failed elements. Proper use of a test and maintenance bus often requires the cooperation of the data and control buses, necessitating some sort of controller element. One such test and maintenance bus is the Joint Test Action Group (JTAG) bus, defined by the standard serial methodology of IEEE Standard 1149.1-1990, used for on-module testing. This standard allows for internal device testing of logic and memory, plus external PCB level connectivity. Specifically, JTAG is a serial bus containing four signal lines: Test Clock (TCK), Test Mode Select (TMS), Test Data Input (TDI), and Test Data Output (TDO). JTAG also defines a Test Access Port (TAP) and boundary-scan architecture for digital integrated circuitry. Taking for example a Printed Circuit Board (PCB), a JTAG master module is responsible for operating the different JTAG scan modes for the entire PCB, specifically by controlling the JTAG slave modules, one of which is present on each hardware device on the PCB.

The JTAG bus provides a solution to the problem of testing assembled printed circuit boards containing highly complex digital integrated circuits and high-density surface-mounting assembly techniques. It also provides a means for accessing and controlling design-for-test features built into the digital integrated circuits themselves. JTAG is used internally in most new large IC designs to confirm that each internal component performs its required function, that the components are interconnected in the correct manner, that the components interact correctly, and that the IC performs its intended functions. For similar reasons, most complex digital modules include a JTAG bus that covers the module design (board interconnections as well as the individual ICs contained on it). One important feature of the JTAG standard is that none of the JTAG scan operations may be run by the JTAG master while a hardware device, such as a chip, is in normal operation since the scanning of internal data will destroy all information previously saved in the internal memory elements (flip-flops). However, this is a small price to pay for the ability to fully test a hardware device in an installed system, for example during power up or during regular offline diagnostic testing. As JTAG has been well documented and is well known to those skilled in the art, the details concerning its different modes of operation will not be described in more detail.

In a preferred embodiment, the present invention uses the above described JTAG scan path to perform the entrainment of a high-speed data transmission bus, where the data transmission bus is local to a PCB and the entrainment takes place at a particular terminal device connected to the data transmission bus. Specifically, since the PCB JTAG master serves no useful function once out of scan mode, this same JTAG master can be used as the entrainment master for the entire PCB after any initial power up scan has completed. One of the advantages of implementing such a method of entrainment control is that the upper control functions are changeable, since they are via software in each JTAG master, and do not require the chip re-spin that is needed in the case where the functions are cast in silicon. Secondly, since each PCB supporting the JTAG standard has its own JTAG master, all high-speed data transmission buses local to the PCB may be entrained in parallel, resulting in a quicker total system entrainment time.

FIG. 1 provides a block diagram of a most preferred embodiment of the current invention, where the PCB 100 supports the JTAG standard. Note that certain support logic is not shown in FIG. 1 for the sake of clarity, and will not be described in any further detail as it is not critical to the success of the present invention. The PCB 100 is capable to support several different hardware devices, in this example devices 102 and 104, each performing various operations, either dependently or independently. The eight line high-speed data transmission bus 108 interconnects devices 102 and 104, and is, in this example, the bus to be entrained. Thus, devices 102 and 104 are terminal devices for the high-speed data transmission bus 108. In an alternative embodiment of this invention, there could be several more devices supported by PCB 100 and, consequently, several more high-speed data transmission buses in need of entrainment, all local to PCB 100.

A JTAG master 106 is responsible for implementing the JTAG scan modes for the PCB 100. Lines 160, 162, 164, 166 and 168 represent signals Test Data Input (TDI), Test Clock (TCK), Test Reset (TR), Test Mode Select (TMS) and Test Data Output (TDO), respectively. These lines constitute the data and control lines for use by the JTAG master 106 when performing either scan operations or data bus entrainment.

Figure 2:
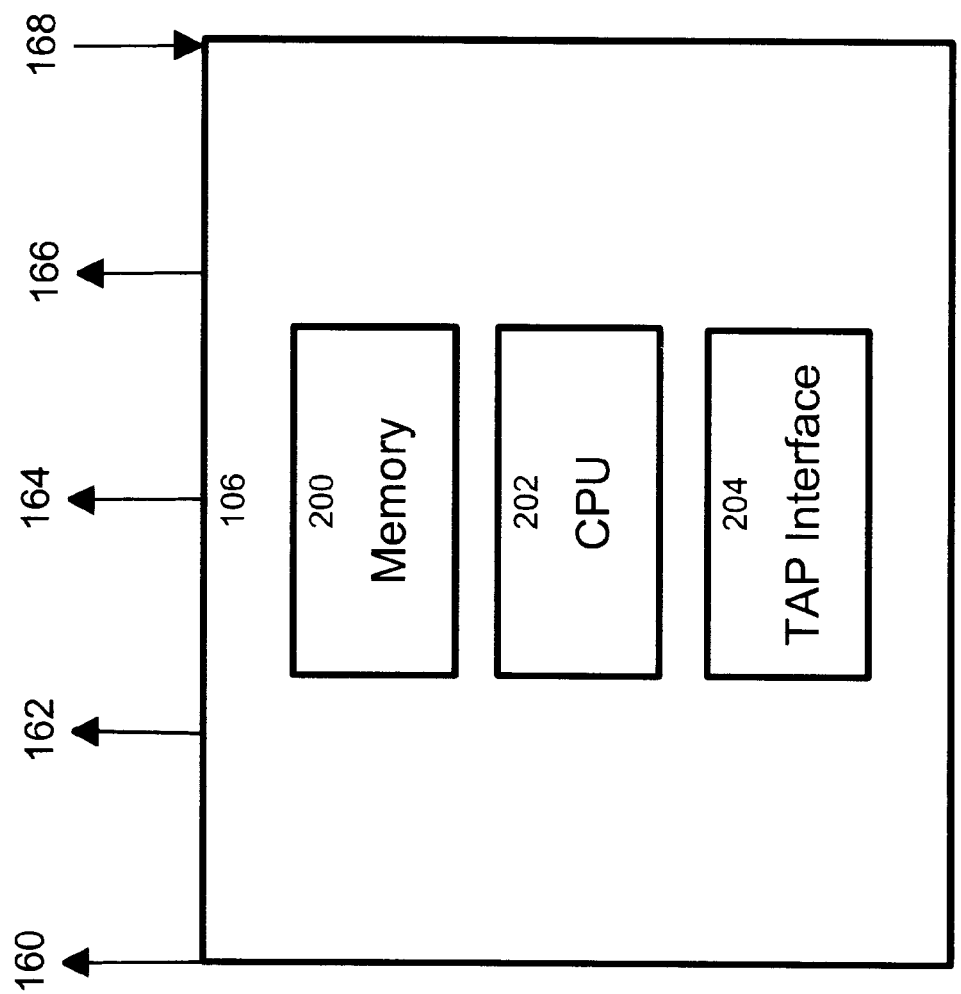
FIG. 2 is a block diagram of the JTAG master module shown in FIG. 1.

FIG. 2 is a block diagram illustrating the JTAG master 106 itself, which is a signal processing component of the PCB 100 and includes primarily a memory 200, a Central Processing Unit (CPU) 202 and a Test Access Port (TAP) interface block 204. The memory 200 contains the various scan data tables required for the JTAG operation, as well as a program element that controls the JTAG scan operations. In addition, all the configuration information required for all the devices supported by PCB 100 can be stored in the memory 200, helping to reduce the device count of PCB 100. The JTAG master 106 is therefore capable to load terminal devices 102 and 104 after the power up scan is finished and before entrainment has begun. The memory 200 further includes a program element that controls the entrainment of the high-speed data transmission bus 108, where this program element is comprised of individual instructions that are executed by the CPU 202, as will be described in more detail below.

The core of the scan functionality within the PCB 100 is the JTAG Test Access Port (TAP). The TAP implements a Finite State Machine (FSM) and a limited number of control/status registers, both of which are implemented on the JTAG slave modules 114 and 116, to be described in more detail below. The TAP includes a TAP interface block 204 that controls access to the TDI 160, TCK 162, TR 164, TMS 166 and TDO 168 lines, for interfacing between the JTAG master 106 and the JTAG slave modules 114 and 116. These control lines are used for selecting the mode of operation to be run by the JTAG master 106 and for accessing and updating control and status registers within terminal devices 102 and 104.

When in its normal mode of operation, the JTAG master 106 is in a static inactive state so as to avoid interfering with the functional operation of the system. In addition to this normal mode of operation, the JTAG master 106 supports a second serial shift mode, referred to for the purposes of this description as a diagnostic mode or a scan mode. This diagnostic mode is used to load internal memory elements within a device, then to sample each element's input and finally to shift out the results of the sampling so as to diagnose or test the device for proper functionality. In this diagnostic mode, all of the internal memory elements (flip-flops) are connected as a long shift register.

Specific to the present invention, a third mode of operation is also supported by the JTAG master 106, specifically a bus entrainment mode. This third mode is enabled by the TAP 204 when suitable conditions exist, i.e. when the PCB 100 is in normal operation and the JTAG master 106 is out of diagnostic mode.

Figure 5:
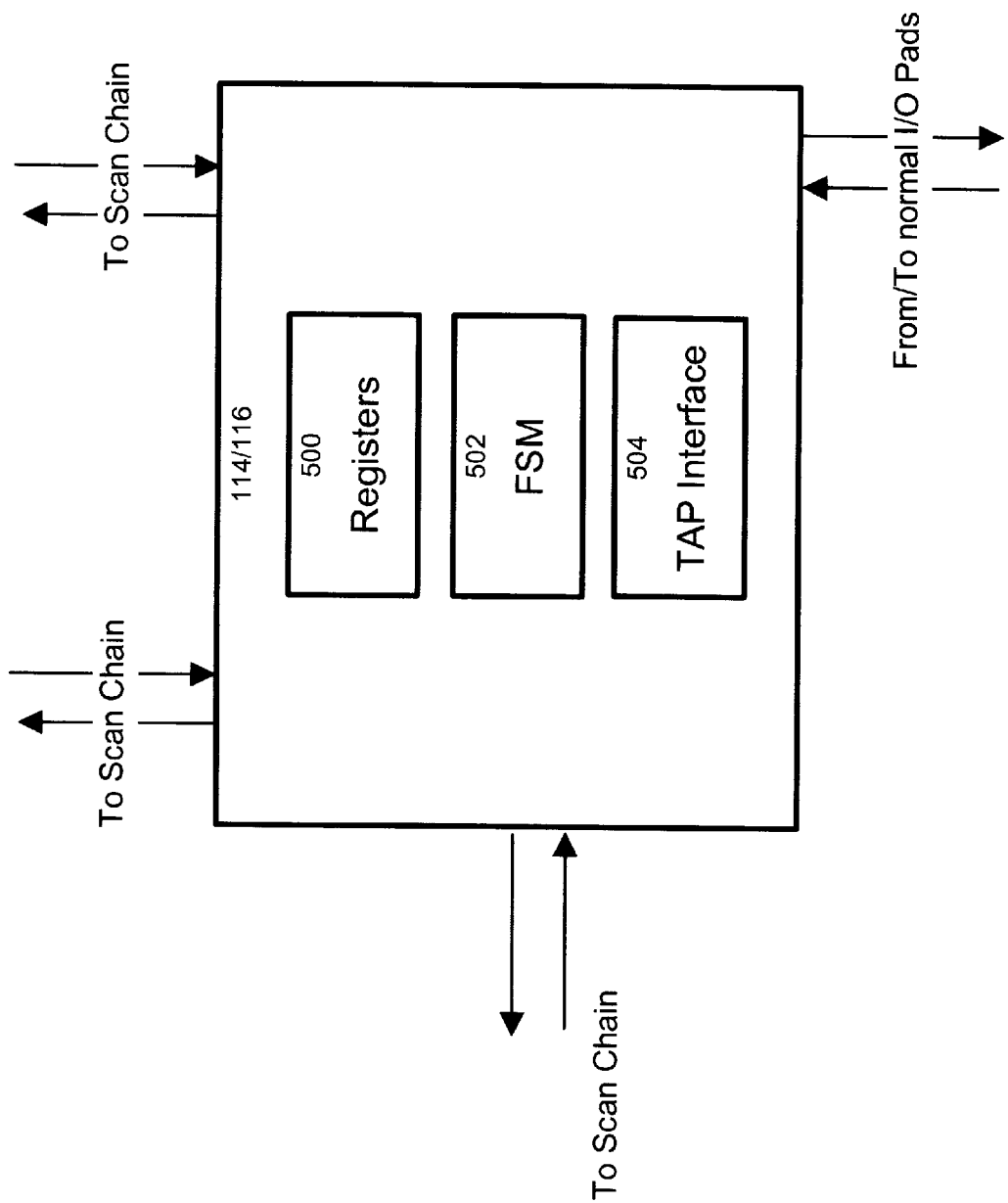
FIG. 5 is a block diagram of a JTAG slave module shown in FIG. 1.

Specific to terminal devices 102 and 104, FIG. 1 reveals that each device has a JTAG slave module, specifically JTAG slave modules 114 and 116, respectively. FIG. 5 is a block diagram of the basic structure of the JTAG slave module, which includes a register block 500 (set of memory elements for storage), an FSM 502, a TAP interface block 504 and connections to the various internal scan chains as well as to the normal I/O pads. The TAP interface block 504 interfaces with the JTAG master 106. Both the register block 500 and the FSM 502 form a part of the TAP, where the FSM 502 is controlled by the TDI 160, TCK 162, TR 164 and TMS 166 signals arriving from the JTAG master 106. The register block 500 comprises control and status registers, including an instruction register and several optional user data registers. Any one of these registers may be selected and loaded, or shifted out via the TDO line 168. Using the instruction register, commands are sent from the JTAG master 106 to the internal JTAG slave 114 or 116. If needed, the slave module can relay these commands to other optional test blocks also included on the device. It is the optional user data registers that are used for JTAG entrainment purposes. Under control of the JTAG master 106, these registers are used to access the entrainment control and status registers within the device and update the entrainment registers' contents as necessary.

Blocks 122 and 124 represent internal logic for device 102, while blocks 126 and 128 represent internal logic for device 104. These blocks implement specific functionality for each device, and will not be described in more detail as this functionality is not critical to the success of the invention. Blocks 118 and 120 represent normal Input/Output (I/O) pads for devices 102 and 104, respectively. These I/O pads are capable of receiving data from and transmitting data to connections to external sources and devices, where these connections do not make use of a high-speed data transmission bus in need of entrainment. Such I/O pads are well known to those skilled in the art, and will not be described in further detail.

The eight data pad cells 110 of terminal device 102 and the eight data pad cells 112 of terminal device 104 are all capable of transmitting data to or receiving data from a particular high-speed connection. For each terminal device, there is one data pad cell for each high-speed connection of the data transmission bus 108. Specific to this example, assume that the high-speed data transmission bus 108 is a uni-directional bus. Therefore, terminal device 102 serves as the transmitting device, while terminal device 104 serves as the receiving device. Consequently, data pad cells 110 may be referred to as drivers or transmitters, while data pad cells 112 may be referred to as receivers. Both sets of data pad cells, acting as either drivers or receivers, implement sampling functionality necessary to the data transmission bus entrainment, to be described in more detail below. In the case where the high-speed data transmission bus to be entrained is a point-to-point bus, as seen in FIG. 1, the entrainment may take place at either the receivers or the drivers. Alternatively, in the case where the bus to be entrained is a point-to-multipoint bus, the entrainment must take place at the receivers, while in the case where the bus to be entrained is a multipoint-to-point bus, the entrainment must take place at the transmitters. In the latter case, data sampling and measuring does take place at the receivers, but this information is sent back to the transmitters where any required adjustment actually occurs.

Each of the high-speed data pad cells 110 and 112 contain registers for controlling the incremental delay of information being received into and driven out of the device, as well as a register for controlling the comparison of primary and monitoring received information. The difference between primary and monitoring received information will be described in further detail below. All of these registers can be loaded into or read from, via a "processor like" control bus which, although not shown in FIG. 1 for purposes of simplifying the block diagram, interconnects the data pad cells and the core of the device and is controlled by the core of the device. This control bus includes 2 address lines for selecting which of the registers to access, a reset signal to put all of the registers into a known initial state, a read control signal, a write control signal and a 4-bit wide information bus for the actual data itself. When the read control signal is active, data is read from the selected register (pointed to by the address lines) and driven into the device on the 4-bit wide information bus. When the write control signal is active, information on the 4-bit wide information bus is stored into the selected register (pointed to by the address lines). If both the read and write control signals are inactive, no operation is performed on the 4-bit wide information bus.

A second pair of signals are also driven into the core of the device from each data pad cell. These signals are the status of the compare between the primary and monitoring information. These are routed to yet another block in the device core that counts the number of equal compares. It is not necessary to always be monitoring these compare signals and therefore not always necessary to be counting the compares from all data pad cells at the same time, so a single compare counter may be multiplexed to count one selected data pad cell at a time, as a hardware optimization.

Taking for example terminal device 102, the JTAG master 106, the JTAG slave module 114 and the above described 4-bit wide information bus and compare counters are all connected together by a block of control logic, specifically block 130. This control logic is responsible for interpreting the contents in one of the JTAG slave module's user data registers as a read or write command to one of the many data pad cells 110 or to the compare counter registers. The control logic also selects which data pad cell or compare counter is to be accessed. Thus, the control logic block 130 allows the JTAG master 106, through the JTAG slave 114, to control the operation of the data pad cells 110 and read back information from the data pad cell registers and compare counter registers. Note that the control logic block 132 on terminal device 104 serves the same purpose as does the control logic block 130 on terminal device 102.

As per the JTAG standard, there are several different scan chains commonly implemented on a PCB. These common scan chains have not all been shown in FIG. 1, in order to simplify the illustration. Specifically, the common JTAG scan chains shown in FIG. 1 include the boundary scan chains, formed by links 146, 148 and 150 on device 102 and links 152, 154 and 156 on device 104, as well as several internal scan chains. These internal scan chains consist in bi-directional links 134 and 136 for device 102 and bi-directional links 140 and 142 for device 104, and are used to test the PCB 100 internal logic. Boundary scan is used to test the PCB 100 connectivity and to test the operation of the I/O drivers and receivers themselves. It can drive the output of each pad high, low or off, plus sample the data on the input pads. One additional common component of the JTAG implementation on PCB 100 comprises link 158, an external scan chain. In the situation where the PCB 100 is supporting several devices, in addition to devices 102 and 104, such inter-device scan chains allow the testing of the entire PCB module design, specifically the board interconnections.

In addition to the common JTAG scan operations, the JTAG standard provides for other, user-definable scan functions. In a most preferred embodiment of this invention, one of these user-definable scan functions will perform the entrainment status gathering and command routing required in order to entrain the high-speed data transmission bus 108. Accordingly, a separate internal scan chain is included on devices 102 and 104, formed by bi-directional link 138 for device 102 and bi-directional link 144 for device 104. Taking for example device 102, this internal scan chain interconnects the JTAG slave module 114 with the control logic block 130, itself connected to the data pad cells 110. The JTAG slave 114 is responsible for communicating with the JTAG master 106. Therefore, this new internal scan chain is responsible for connecting the specific entrainment status and control logic information to the JTAG master 106, when the latter is in bus entrainment mode. Once available to the TAP interface 204, the JTAG master 106 can then output entrainment commands and receive status feedback from the pad cells and other entrainment logic.

The use of a JTAG scan chain as an entrainment scan chain, as described above, provides the ability to send commands to the drivers 110 and receivers 112 and to read status information from the receivers 112. Specifically, the entrainment scan chain is capable to move transmitter information from the JTAG master 106 to the transmit control register 130 and to move receive command and status information to and from the receivers 112 and the JTAG master 106.

Figure 3:
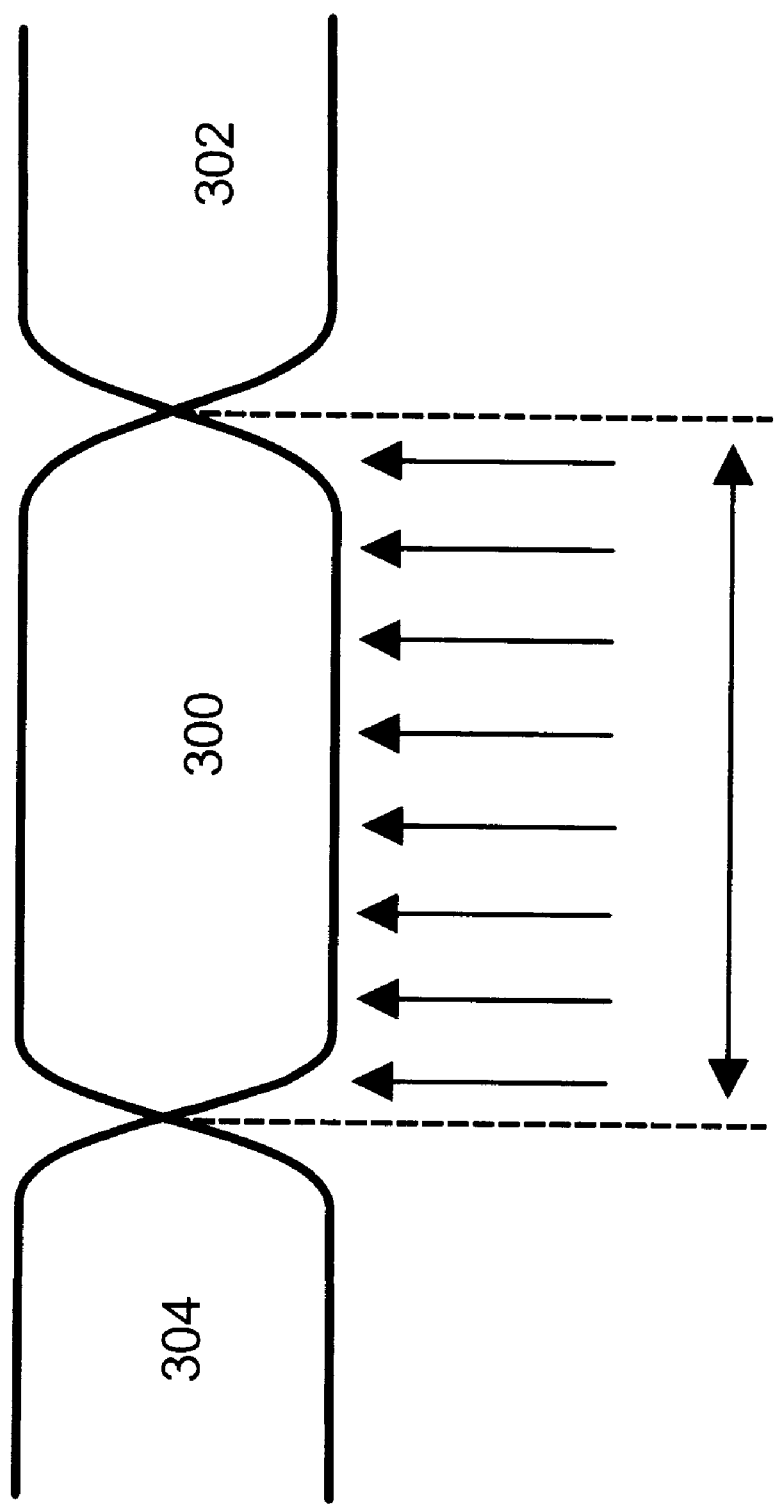
FIG. 3 is a schematic illustrating the possible sample points of a bit eye diagram.

Sample point entrainment is done by driving out a known bit pattern at a selected transmitter and measuring the response at a selected receiver. The suggested sample point entrainment pattern is a series of alternating 1s and 0s for the duration of a complete frame. FIG. 3 shows different sample points in relation to a bit eye diagram. Data bit 300 is to be viewed as the valid data bit, while data bit 302 is the previous data bit and data bit 304 is the next data bit. By adjusting either the transmitter drive point or the receiver sample point, the sample point can be placed in the center of the received bit's eye pattern. During post power up, multiple bits could be entrained in parallel, but in a working system it is possible to entrain some bits in a bus while the other bits may be moving mission mode data. In order to perform entrainment of a data transmission bus, it is necessary to be able to monitor how near the selected sample point is to the edge of the eye diagram. Therefore, each data pad cell, either driver or receiver, includes an eye monitor and compare function to take another monitoring information sample at a second point in the eye diagram and compare the sampled data value (primary information) against the value of this second sample point (monitoring information). The results of the compare are then available to be examined and acted upon, the results indicating either that the current sample point is no longer in the center of the bit eye and must be shifted, or that the sample point is correctly positioned and need not be shifted. As the theory behind sample point entrainment is well known to those skilled in the art and has been well documented, it will not be described in further detail.

Figure 4:
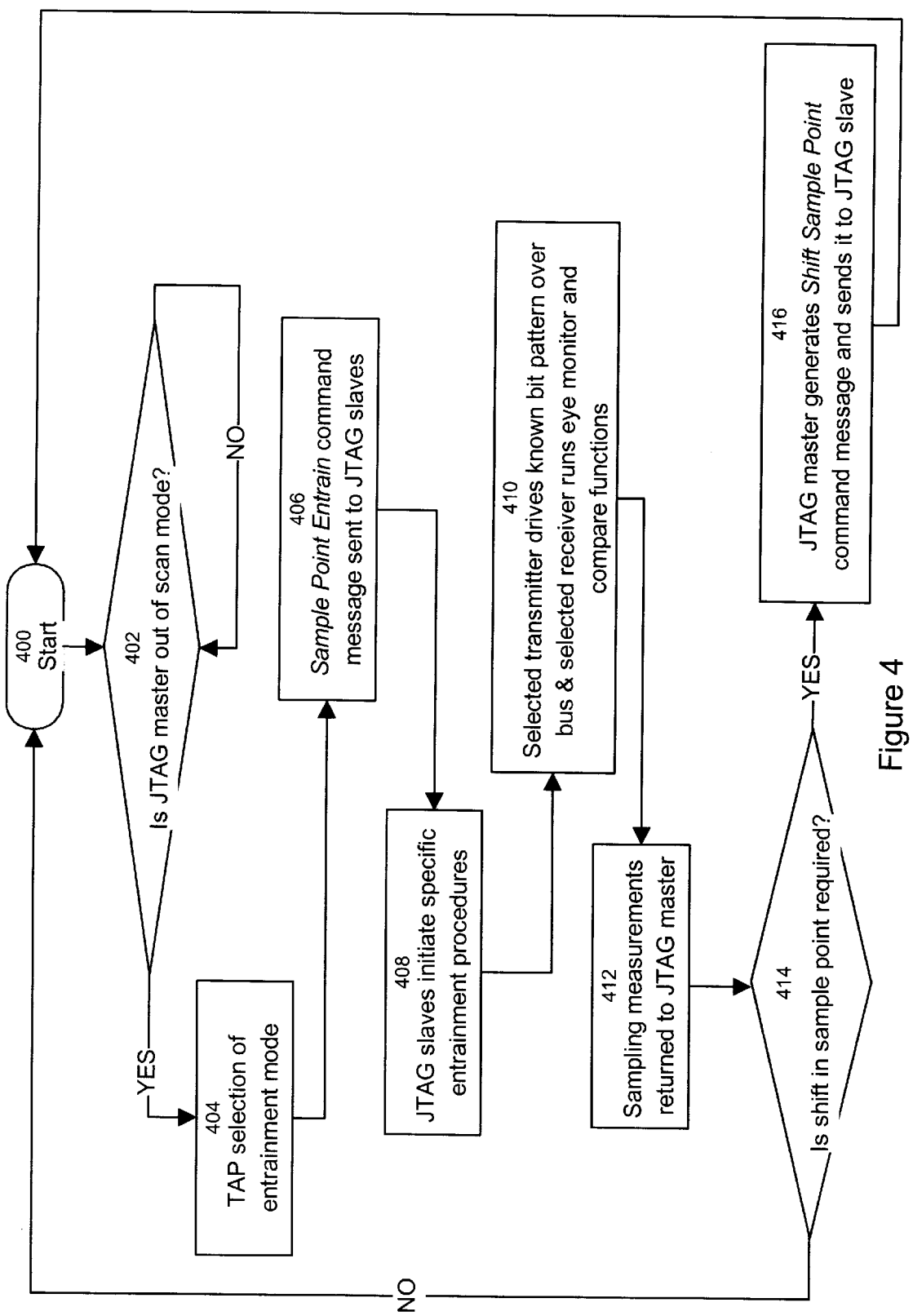
FIG. 4 is flow chart illustrating the operation of a program element in the JTAG master depicted in FIGS. 1 and 2, which implements the high-speed data transmission bus entrainment process, in accordance with this invention.

Specific to the example shown in FIG. 1, assume that the data transmission bus 108 entrainment takes place at the receivers 112 of terminal device 104. FIG. 4 provides a complete flowchart illustrating an example of the operation of the program element stored in the memory 200 of the JTAG master 106, and executed by the CPU 202, that regulates the entrainment of the high-speed data transmission bus 108. At step 402, the program element first ensures that the JTAG master 106 is out of scan mode. If the JTAG master 106 is currently performing a scan operation, the entrainment process will not take place. If the JTAG master 106 is at rest, the TAP 204 may select to run the bus entrainment mode at step 404. At step 406, separate Sample Point Entrain command messages are sent by the JTAG master 106 to the JTAG slaves 114 and 116. The command message sent to slave 114 includes a tag indicative of the specific driver to be used, while the command message sent to slave 116 includes a tag indicative of the specific receiver to be used and at which the entrainment sampling and comparing is to take place. At step 408, control is passed to the JTAG slaves 114 and 116, each responsible for the specific and different entrainment steps to be implemented on their own device, effected with the use of the control logic blocks 130 and 132 and the entrainment scan chains 138 and 144. Each slave extracts from the received control message the identification of the specific data pad cell involved in the entrainment process, and generates and sends a specific directive message over the entrainment scan chain to the control logic block. At step 410, the control logic 130 drives a known bit pattern, for example a frame of alternating 1s and 0s, out of the selected driver, while the control logic 132 will initiate the eye monitor and compare functions at the selected receiver. The measurements that result from this data sampling are returned to the JTAG slave 116 over entrainment path 144, at step 412. The JTAG slave 116 is responsible for forwarding these measurements to the JTAG master 106 over TDO line 168. At step 414, control returns to the JTAG master 106, which examines the sampling measurements and determines whether or not a shift in the sample point of the selected receiver is required. If a shift in the sample point is required, a Shift Sample Point command message is generated by the JTAG master 106 at step 416, where this command message includes a first tag identifying the specific receiver, as well as a second tag indicative of the amount of shift required for the sample point. This command message is sent to the JTAG slave 116, responsible for initiating the sampling circuit for terminal device 104, capable to perform the fine grain adjustment of the selected receiver's bit sample point. Since data bus entrainment is a continuous process, necessary in order to properly track changes in temperature, voltage or any other variations causing a shift in the transmitted data, step 416 is succeeded by a return to the beginning of the entrainment process at step 400.

In an alternative embodiment of this invention, the high-speed data bus to be entrained interconnects two devices on two different PCBs. In such an implementation, the JTAG scan path may also be used to perform the sample point entrainment, where the JTAG standard supported by the PCBs is slightly different from that described above. Specifically the IEEE Standard 1149.5 is used, a JTAG standard designed specifically for inter-module testing.

The above description of a preferred embodiment under the present invention should not be read in a limitative manner as refinements and variations are possible without departing from the spirit of the invention. The scope of the invention is defined in the appended claims and their equivalents.

We claim:

1. A control device for use on an electronic circuit board to effect high-speed data transmission bus entrainment, said control device including:

an input for receiving first signals;

an output for transmitting second signals;

a signal processing component coupled to said input and to said output, said signal processing component capable of acquiring either one of two modes of operation, namely a diagnostic mode and a bus entrainment mode, in said diagnostic mode said first and said second signals being control signals permitting to perform a diagnostic procedure on the electronic circuit board, in said bus entrainment mode said first and said second signals being control signals to perform a bus entrainment procedure.

2. A control device as defined in claim 1, wherein said diagnostic mode complies to the JTAG standard.

3. A control device as defined in claim 2, wherein the second signals when said control device is in said bus entrainment mode direct either one of a driver device and a receiver device coupled to the high-speed data bus to shift a data bit sample point.

4. A control device as defined in claim 3, wherein said control device includes a JTAG master device in a data communicative relationship with a JTAG slave device.

5. A control device as defined in claim 4, wherein said control device includes a JTAG master device in a data communicative relationship with a plurality of JTAG slave devices.

6. A control device as defined in claim 4, wherein said JTAG master device includes:

a processor;

a memory in operative relationship with said processor, said memory including a program element implementing functions to cause said control device to selectively acquire said diagnostic mode or said bus entrainment mode.

7. A control device as defined in claim 6, wherein said program implements a verification function to prevent one of said modes from being acquired by said control device when the other mode is active.

8. An electronic circuit board, comprising:

a high-speed data transmission bus;

a JTAG diagnostic system, said JTAG diagnostic system capable to acquire either one of two modes of operation, namely a diagnostic mode and a bus entrainment mode, in said diagnostic mode said JTAG diagnostic system performing a diagnostic operation on said electronic circuit board and in said bus entrainment mode said JTAG diagnostic system performing entrainment of said high-speed data transmission bus, said bus entrainment mode being acquired when said JTAG diagnostic system is out of said diagnostic mode.

9. An electronic circuit board as defined in claim 8, wherein said JTAG diagnostic system includes a master device and a plurality of slave devices.

10. An electronic circuit board as defined in claim 9, wherein each of the plurality of slave devices is in a data communicative relationship with the master device.

11. An electronic circuit board as defined in claim 10, wherein each of the plurality of slave devices is local to a different component on said electronic circuit board.

12. An electronic circuit board as defined in claim 8, wherein said high-speed data transmission bus includes two terminal devices, each terminal device including a local slave device.

13. A system for performing entrainment of a high-speed data bus between a first and a second terminal devices, said system including:

a master device;

a first slave device in said first terminal device, said first slave device being in a data communicative relationship with said master device;

a second slave device in said second terminal device, said second slave device being in a data communicative relationship with said master device;

said first slave device being responsive to a control signal from said master device to cause said first terminal device to issue over the high-speed data bus a certain bit pattern;

said second slave device being responsive to the bit pattern as received by said second terminal device to issue a signal representative of the bit pattern as received by said second terminal device;

said master device being responsive to the signal issued by said second slave device to generate a bus entrainment control signal capable of being used at either one of said first and second terminal devices to perform entrainment of the high-speed data bus.

14. A method for performing entrainment of a high-speed data transmission bus on an electronic circuit board, the electronic circuit board including a JTAG diagnostic system capable to selectively acquire either one of a diagnostic mode and a bus entrainment mode, in the diagnostic mode the JTAG diagnostic system performing a diagnostic procedure on the electronic circuit board, in the bus entrainment mode the JTAG diagnostic system performing a bus entrainment procedure on the high-speed data transmission bus, said method comprising:

detecting when the JTAG diagnostic system is out of the diagnostic mode;

causing the JTAG diagnostic system to acquire the bus entrainment mode.

15. A control device for use on an electronic circuit board to effect high-speed data transmission bus entrainment, said control device including:

an input for receiving first signals;

an output for transmitting second signals;

signal processing means coupled to said input and to said output, said signal processing means capable of acquiring either one of two modes of operation, namely a diagnostic mode and a bus entrainment mode, in said diagnostic mode said first and said second signals being control signals permitting to perform a diagnostic procedure on the electronic circuit board, in said bus entrainment mode said first and said second signals being control signals to perform a bus entrainment procedure.

* * * * *